United States Patent [19]

Suster et al.

[11] 4,344,109
[45] Aug. 10, 1982

[54] FLASH LAMP ARRAY HAVING PRINTED CIRCUIT

[75] Inventors: Mary E. Suster, Chagrin Falls; Vincent H. Weber, Parma, both of Ohio

[73] Assignee: General Electric Company, Schenectady, N.Y.

[21] Appl. No.: 191,917

[22] Filed: Sep. 29, 1980

[51] Int. Cl.³ .............................................. G03B 15/02
[52] U.S. Cl. ........................................ 362/13; 362/10; 362/240; 362/241; 431/359
[58] Field of Search .................... 362/13, 10, 240, 241; 431/359

[56] References Cited

U.S. PATENT DOCUMENTS

| | | | |
|---|---|---|---|
| 3,608,451 | 9/1971 | Kelem | 362/13 |
| 3,952,320 | 4/1976 | Blount | 362/11 |
| 3,980,876 | 9/1976 | Cote | 362/15 |
| 3,990,832 | 11/1976 | Smialek et al. | 431/359 |
| 4,019,043 | 4/1977 | Blount | 362/5 |
| 4,028,798 | 6/1977 | Bechard et al. | 29/838 |
| 4,104,705 | 8/1978 | Levand et al. | 362/13 |
| 4,133,023 | 1/1979 | Hanson | 362/13 |
| 4,166,287 | 8/1979 | Atwood | 362/13 |

*Primary Examiner*—Irwin Gluck
*Attorney, Agent, or Firm*—Norman C. Fulmer; Philip L. Schlamp; Fred Jacob

[57] ABSTRACT

A flash lamp array having a plurality of high-voltage flash lamps in front of a reflector unit and a circuit board behind the reflector unit and carrying a plurality of circuit runs of relatively high resistance inexpensive material such as powered carbon and including a common or "ground" circuit run connected to a lead-in wire of each lamp. A shield is positioned behind the circuit board and is connected to the common circuit run near a connector tab at an end of the circuit board. This reduces the possibility of accidental flashing of lamps by electrostatic electricity.

5 Claims, 6 Drawing Figures

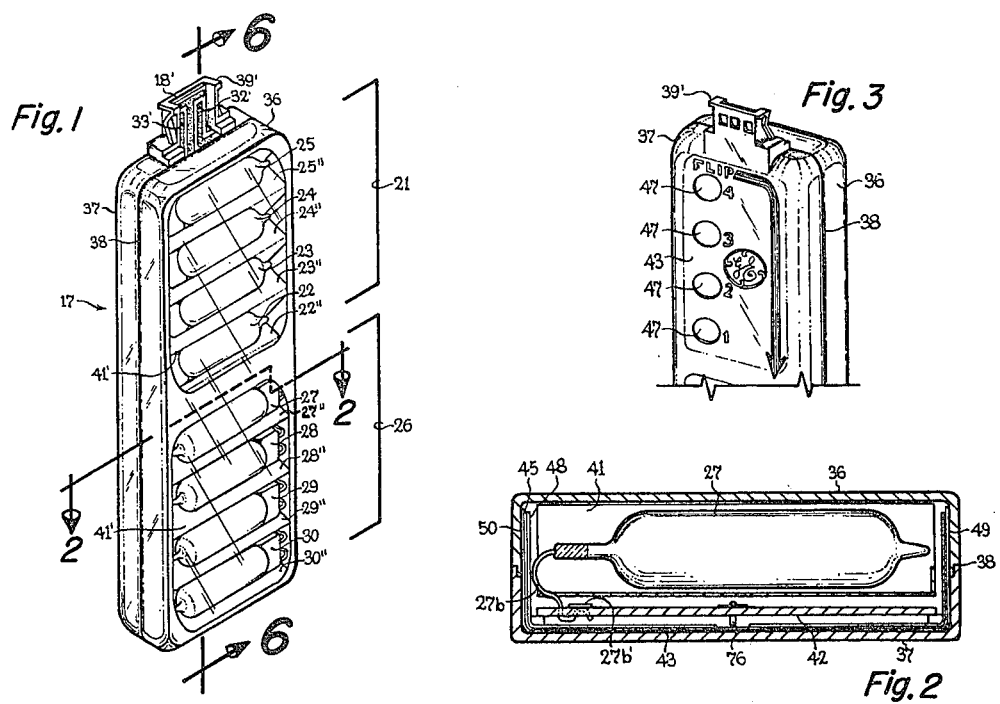
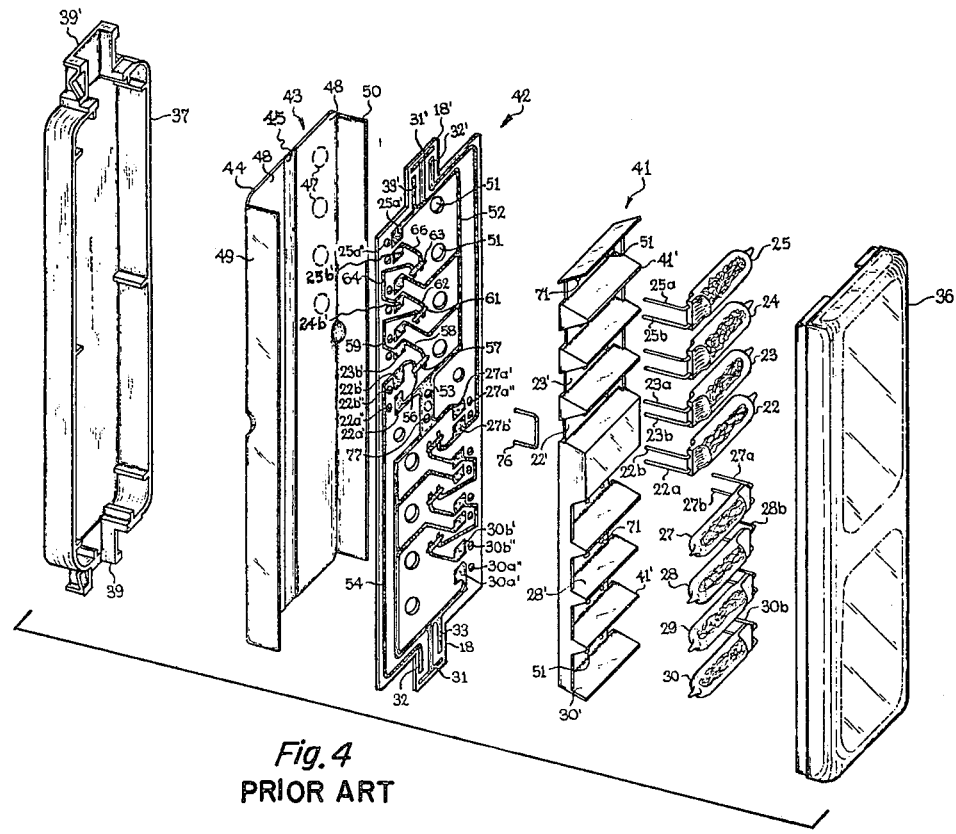
Fig. 4 PRIOR ART

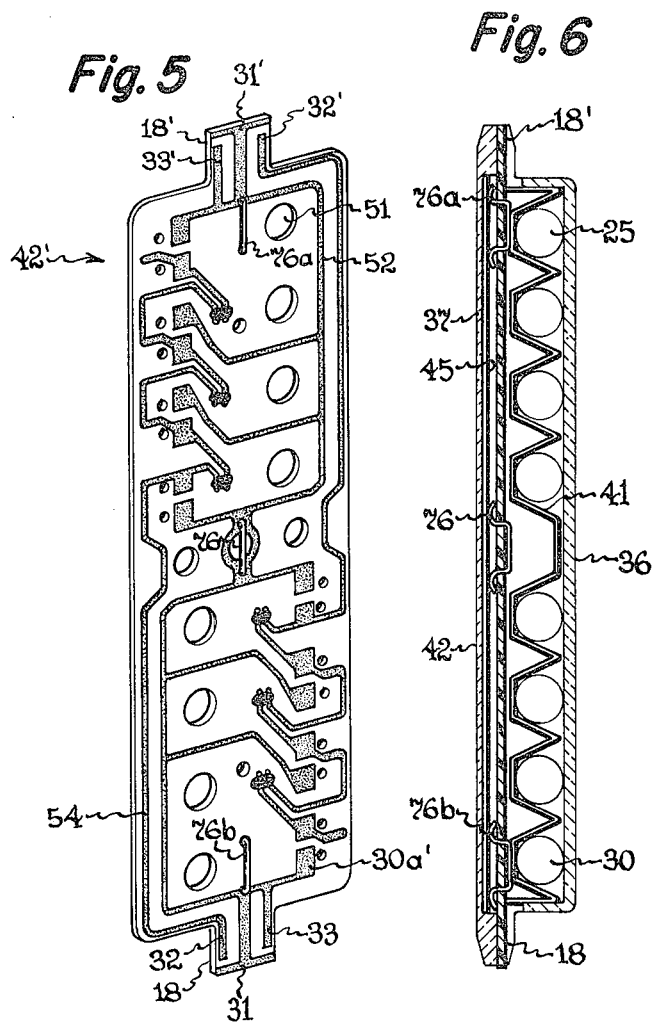

FLASH LAMP ARRAY HAVING PRINTED CIRCUIT

CROSS-REFERENCE TO RELATED APPLICATION

Ser. No. (191916), filed concurrently herewith, Edward J. Collins, Mary E. Suster and Vincent H. Weber, "Flash Lamp Array Having Printed Circuit," assigned the same as this invention.

BACKGROUND OF THE INVENTION

The invention is in the field of photo flash lamp arrays, such as the Flip Flash type of array.

U.S. Pat. No. 4,133,023 to Hanson discloses a Flip Flash type of array having a plurality of high-voltage flash lamps and their reflectors positioned in front of a circuit board. The circuit board is shaped to provide connector tabs for connection to a camera socket. Each connector tab carries a plurality of connection terminals which include an electrical ground or "common" terminal. Circuits runs carried on the board connect the terminals to the lamps and to circuitry whereby a lamp is flashed each time a firing voltage pulse is applied to the terminals. "Common" circuit runs on the board connect a lead-in wire of each flash lamp to the common connection terminals. A metal foil shield is positioned behind and parallel to the circuit board and is electrically connected to the common circuit runs and terminals by suitable conductive means such as a wire staple through the center of the circuit board.

The circuit runs on Flip Flash circuit boards are formed with a conductive ink containing silver. Given the high cost of silver, multiplied by the tens of millions of Flip Flash arrays manufactured per year, the cost of the circuit run material is considerable and it would be desirable to reduce this cost.

The above-referenced patent application discloses a flash array having a circuit board on which the circuit runs are made from an inexpensive material comprising carbon particles applied to the board in a liquid binder which is then dried and evaporated. These circuit runs have a considerably higher resistance (generally 30 or 40 times, or more) than the previously employed silver-containing conductive ink. Flash arrays having the high-resistance circuit runs have an increased tendency for lamps to accidentally flash due to electrostatic electricity, for example when a "charged" person handles the array or touches its connector terminals. It has been ascertained that this is due to the high resistivity of the connection between the shield and the "common" connector terminals. The referenced patent application solves the problem by connecting the shield to the common circuit run near both ends of the flash array, reducing the resistance between the shield and the common connector terminals.

SUMMARY OF THE INVENTION

Objects of the invention are to provide an improved flash array construction, to reduce the cost of circuit run material on the circuit board and to prevent accidental flashing of lamps by electrostatic voltage.

The invention comprises, briefly and in a preferred embodiment, a photo flash lamp array having a plurality of flash lamps and their reflectors positioned in front of a circuit board which is provided with connector terminals at an end thereof for being connected to a camera socket and for receiving firing voltage pulses for causing the lamps to flash. Circuit runs of high resistance inexpensive material, such as carbon particles, are carried on the board to connect the terminals to sequential lamp-flashing circuitry. One of the connector terminals is connected in common to a lead-in wire of each of a plurality of lamps by means of the circuit run material. A wire staple or other connecting means electrically connects the common circuit run to a shield behind the circuit board, this connecting means being at or near the connector terminals at the end of the circuit board.

BRIEF DESCRIPTION OF THE DRAWING

FIG. 1 is a perspective view of a multiple flash lamp array in accordance with the prior art.

FIG. 2 is a cross-sectional view of FIG. 1, taken on the line 2—2 thereof.

FIG. 3 is a perspective rear view of part of the prior-art flash array.

FIG. 4 is an exploded perspective view of the prior-art flash array.

FIG. 5 is a perspective view of a flash array circuit board in accordance with a preferred embodiment of the invention.

FIG. 6 is a side sectional view of a flash array in accordance with the preferred embodiment of the invention, taken on the line 6—6 of FIG. 1 with the circuit board of FIG. 5 therein.

DESCRIPTION OF THE PREFERRED EMBODIMENT

In FIGS. 1 through 4, which show a prior-art flash array as disclosed in the above-referenced Hanson patent, a vertically elongated multiple flash lamp unit 17 of the planar array type and containing a plurality of electrically fired flash lamps is provided with a plug-in connector tab 18 at the lower end thereof, adapted to fit into a socket of a camera or flash adapter. The lamp array 17 is provided with a second plug-in connector tab 18' at the top end thereof, whereby the array 17 is adapted to be attached to the camera socket in either of two orientations, i.e., with either the tab 18 or the tab 18' plugged into the socket. The array 17 is provided with an upper group 21 of elongated flash lamps 22, 23, 24, and 25, lying horizontally and stacked vertically, and a lower group 26 of flash lamps 27, 28, 29, and 30, lying horizontally and stacked vertically, all of the lamps being arranged in a planar configuration. Reflectors 22', etc., are disposed behind and partly around the respective flash lamps, so that as each lamp is flashed its light is projected forwardly of the array 17. The lamps are arranged and connected so that when the array is connected to a camera by the connector 18, only the upper group 21 of the lamps will be flashed, and when the array is turned end for end and connected to the camera by the other connector 18', only the then upper group 26 of lamps will be flashed. By this arrangement, only lamps relatively far from the lens axis are flashable, thus reducing the well-known undesirable red-eye effect.

The general construction of the array comprises front and back housing members 36 and 37, which preferably are made of plastic. In the preferred embodiment shown, the front and back housing members are joined together at their sides as indicated by the seam line 38, and the back housing member 37 includes integral extensions 39 and 39' at the ends thereof which partly surround and protect the connector tabs 18 and 18' and also function to facilitate mechanical attachment to the camera socket. Sandwiched between the front and back of the housing members 36 and 37, in the order named, are the flash lamps 22, etc., a unitary reflector and barrier member 41 (preferably of white plastic) shaped to provide the individual reflectors 22', etc. and barriers 41' between adjacent lamps to prevent sympathetic flashing of a lamp when an adjacent lamp is flashed, a printed circuit board 42 provided with integral connector tabs 18 and 18', and a combined shield and indicia sheet 43 which may be provided with instructions, information, and other indicia such as flash indicators 47 located behind the respective lamps and which change color due to heat and/or light radiation from a flashing lamp, thus indicating at a glance which of the lamps have been flashed and not flashed.

The indicia sheet 43 may be of paper or thin cardboard 44 coated with a layer of metal 45, such as aluminum, on its front or inner surface, and provided with openings where the flash indicators 47 are desired, and flash indicator material 48, such as a sheet-like heat sensitive plastic material, for example biaxially oriented polypropylene, which shrinks or melts when subjected to heat or radiant energy from an adjacent flashing lamp, is positioned over the openings for the flash indicators 47 thus effectively changing the color at these openings when the adjacent lamps are flashed. For example, the plastic material can be colored green on its back side by ink or other suitable means, and the green disappears when the opening becomes a different color (dark, for example) when the plastic shrinks or melts away due to heat from an adjacent flashing lamp. The front of the plastic (toward the lamps) should be coated with dark ink so as to absorb heat more readily. One or more flash indicator sheets 48 may be arranged over portions of the metal coating 45 to cover over all of the flash indicator openings. Window means 51 in the form of openings or transparent areas are provided through the reflector and barrier unit 41 and the circuit board 42 to facilitate radiation from flashing lamps reaching the flash indicators 47. The metal coating 45 functions as a shield and extends onto frontwardly bent side portions 49, 50 of the indicia sheet 43 to provide shielding at the sides of the array and flanking the flash lamps. The rear housing member 37 is transparent (either of clear material or provided with window openings) to permit viewing of the indicia on the indicia sheet 43. The front housing member 36 is transparent at least in front of the lamps 22, etc., to permit light from flashing lamps to emerge frontwardly of the array, and may be tinted to alter the color of light from the flash lamps and also may be provided with lenses or prisms for controlling the light distribution pattern.

The height and width of the rectangular array are substantially greater than its thickness, and the heights and widths of the reflector and barrier member 41 and circuit board 42 are substantially the same as the inertior height and width of the housing members, to facilitate holding the parts in place.

The reflector and barrier member 41 is a one-piece member, preferably of molded white plastic interspersed with titanium dioxide, shaped to provide the reflectors 22' etc. in the form of planar rear portions behind the respective lamps, and the tapered reflector sides 22", etc. between adjacent lamps which also form the barriers 41' for preventing sympathetic flashing by which a lamp adjacent to a flashing lamp could be caused to flash due to heat and/or light radiation from the flashing lamp.

The tab 18, which is integral with the circuit board 42, is provided with a pair of electrical terminals 31 and 32, and similarly the tab 18' is provided with a pair of terminals 31' and 32', for contacting terminals of a camera socket for applying firing voltage pulses to the array. The terminals 31 and 31' are connected together and to a lead-in wire of each lamp, and constitute part of the electrical ground circuit of the array. Each tab is provided with a third terminal 33 and 33', respectively, which is connected respectively to the terminals 31 and 31', as disclosed in U.S. Pat. No. 4,166,287 to Atwood. Alternatively, these third terminals can be connected to the opposite group of lamps and circuits as disclosed in U.S. Pat. No. 3,952,320 to Blount. The terminals 31 and 31' are shown as having a lateral "T-bar" configuration for temporarily shorting the socket terminals while the array is being plugged in, to discharge any residual voltage charge in the firing pulse source and also to reduce the likelihood of lamps being accidentally flashed by electrostatic voltage when the array is handled, as is disclosed in U.S. Pat. No. 3,980,876 to Cote.

The circuit board 42 has a "printed circuit" thereon, as will now be described, for causing sequential flashing of the lamps by firing voltage pulses applied to the terminals 31, 32 or 31', 32'. The top and bottom halves of the printed circuitry preferably are reverse mirror images of each other. In the preferred embodiment shown, a pair of printed circuit pads 22a' and 22b' are provided on the circuit board, to which the lead-in wires 22a and 22b of lamp 22 are to be connected. Similarly, circuit pads 23a' and 23b' through 25a' and 25b', and 27a' and 27b' through 30a' and 30b' are provided for connection to the lead-in wires of the remaining lamps, the numbers and letters in the circuit pad designations corresponding to those of the lamp lead-in wire. The circuit pads for the group 21 of lamps are aligned in a row near one edge of the circuit board, and the circuit pads for the other group 26 of lamps are aligned in a row near the other edge of the circuit board, and on the opposite half of the board. The respective lead-in wires 22a, 22b, etc. of the lamps may be attached to the connector pads 22a', 22b', etc. in various ways, such as being ultrasonically driven into the circuit board and against the appropriate connector pads as disclosed in U.S. Pat. No. 4,028,798 to Bechard et al. In this technique openings 22a" and 22b", etc. are provided through the circuit board through or adjacent to the connector pads 22a' and 22b', etc. The lead-in wires 22a and 22b, etc. of the flash lamps are placed through the respective openings 22a" and 22b", etc. from the front of the circuit board, are laid on the back of the circuit board, and are driven by ultrasonic drivers into the board to make electrical and mechanical contact with the respective circuit pads 22a' and 22b', etc. As shown, the flash lamp lead-in wires emerge from each elongated bulb at an end thereof and with the lamps positioned horizontally and stacked vertically their lead-in wires are near a side of the array and are bent approximately as shown in FIG. 2 for connection to the respective adjacent circuit pads.

In accordance with the prior art, as shown in FIG. 4, all of the "a'" circuit pads are connected electrically together and to the common electrical ground connector terminals 31 and 31', by a circuit run 52 which includes a ground pad area 53 at the center of the circuit board. The "electrically hot" connector terminal 32 is connected via a circuit run 54 to the circuit pad 22b' and to a radiation switch terminal 56. A radiation activated switch 57 is connected across and between the switch terminal 56 and a switch terminal 58 which connects to the next "hot" lamp circuit pad 23b'. Similarly, a switch terminal 59 is connected to the lamp pad 23b', and a radiation activated switch 61 is connected across and between the terminal 59 and a switch terminal 62 which is connected to the lamp pad 24b'. A third radiation activated switch 63 is connected across and between a circuit run terminal 64 connected to pad 24b' and a circuit run terminal 66 connected to the lamp pad 25b'. The radiation activated switches 57, 61, and 63 are respectively located behind the lamps 22, 23, and 24, and initially have a high impedance such as several thousand ohms or over a million ohms. Window means 71 such as transparent sections or openings through the back of the reflector-barrier unit 41 permit light and heat radiation from the flash lamps, when flashed, to reach the radiation switches and convert them to zero or low impedance such as a few hundred ohms so as to connect the "hot" connector terminal 32 to the next lamp to be flashed. A suitable material for the radiation switches is silver oxide dispersed in a binder such as polyvinyl resin. Another suitable radiation switch material is disclosed in U.S. Pat. No. 3,990,832 to Smialek et al. Each of these radiation switches, upon receiving heat and/or light radiation from the adjacent lamp when it is flashed, changes from an open circuit or high resistance to a closed circuit or low resistance between its switch terminals on the circuit board.

As has been explained, the lower portion of the circuit board contains a substantially reverse mirror image of the same circuit shown in the upper part of the circuit board, and therefore will not be described in detail. It will be noted that the circuit runs from the plugged-in terminals 31 and 32 at the lower part of the circuit board extend upwardly so as to activate the circuitry in the upper half of the circuit board. Similarly, when the unit is turned around and tab 18' is plugged into a socket, the circuit board terminals 31' and 32' will be connected to and activate the lamps which then will be in the upper half of the flash unit 17. This accomplishes, as has been stated, the desirable characteristic whereby only the group of lamps relatively farthest away from the lens axis will be flashed, thereby reducing or eliminating the undesirable red-eye effect. For convenience in laying out the circuit board runs, the pads 22a' and 22b' of lamp group 21, and pads 27a' and 27b' of lamp group 26, are relatively reversed with respect to the other pads of the respective groups.

The circuit on the circuit board 42 functions as follows. Assuming that none of the four lamps in the upper half of the unit 17 have been flashed, upon occurrence of a first firing pulse applied across the terminals 31, 32, this pulse will be directly applied to the lead-in wires of the first-connected flash lamp 22, whereupon the lamp 22 flashes and becomes an open circuit between its lead-in wires. Heat and/or light radiation from the flashing first lamp 22 causes the adjacent radiation switch 57 to become a closed circuit (or a low value of resistance), thereby connecting the circuit board terminal 32 electrically to the lead-in wire 23b of the second lamp 23. By the time this occurs, the firing pulse has diminished to a value insufficient to cause the second lamp 23 to flash. When the next firing pulse occurs, it is applied to the lead-in wires of the second lamp 23, via the now closed radiation switch 57, whereupon the second lamp 23 flashes, thereby causing radiation switch 61 to assume zero or low resistance. The second lamp 23 now has an open circuit or high resistance between its lead-in wires. When the next firing pulse occurs, it is applied via now closed radiation switches 57 and 61 (in series) to the third lamp 24, thereby firing the lamp which becomes an open circuit, and the radiation from it causes the radiation switch 63 to become essentially a closed circuit across its terminals. Thus, the next firing pulse will be applied, via now closed radiation switches 57, 61, and 63 (in series) to the lead-in wires of the fourth flash lamp 25, thereupon causing the lamp to flash. Since this lamp is the last lamp in the active circuit, it does not matter whether its lead-in wires are an open or closed circuit after flashing. Additional flash lamps, radiation switches, and electrical conductors can be employed, if desired, using the just described principles. When the flash unit is turned around the other connector tab 18' attached to the camera socket, the group of lamps that then become uppermost and relatively farthest away from the lens axis will be in an active circuit and will be flashed in the same manner as has been described. In a preferred embodiment, the lamps 22, etc., are high voltage types, requiring about 2000 volts for example, at low current, for flashing, and they can be fired by impacting or stressing a piezoelectric element in the camera.

In the prior art of FIG. 4, a wire staple 76 is placed through openings 77 through the circuit board at the electrical ground pad 53, and its projections at the rear of the board are curved along the rear surface of the board and contact against the conductive shield member 45, thus electrically connecting the shield 45 to the electrical ground of the circuit, as is disclosed in U.S. Pat. No. 4,104,705 to Levand.

The rear metal shield 45 extends frontwardly to the front edges of the indicia sheet sides 49 and 50 and can extend as far frontwardly as permitted by the housing, and flanks the sides of the flash lamps 22 etc. to provide effective shielding at the sides of the array.

Also, the plastic flash indicator material 48 may extend alongside the inner surface of the metal shield 45 frontwardly extending portions which flank the flash lamps a sufficient distance so as to provide electrical insulation between the flash lamp lead-in wires 22a, 22b, etc. and the metal shield 45 in order to avoid accidental short-circuiting of the "hot" lamp lead-in wires 22b, etc. to the metal shield 45 which would prevent proper functioning of the lamps and the lamp firing sequencing circuitry.

As can be seen in the prior art construction of FIG. 4, the circuit runs require a considerable amount of circuit-run ink material which preferably contains silver (which is expensive) to provide good electrical conductivity and which, unlike other materials, maintains good surface contact conductivity even when the surface becomes oxidized in time due to exposure to air. Attempts have been made to reduce the cost of the circuit board by substituting low-cost material, having substantially higher resistance than metal such as powdered carbon, for the silver circuit runs. The carbon particles are carried in a liquid binder, such as acrylic and butyrate resins in glycol ether and ketone solvents, and applied to the circuit board by conventional silk-screening technique. Heat may be applied to hasten evaporation of the binder solvent, which occurs in about a minute, leaving the carbon-particle circuit runs adhered to the board and having a thickness of about 1 or 2 mils. The circuit runs are conductive due to the carbon particles touching one another, and the cost of the carbon circuit run material is much less than that of the conventional material containing silver. Although the resistance of the carbon circuit runs is high compared to that of the silver runs, the high-voltage types of lamps are flashed satisfactorily by the firing pulses which are high voltage (2,000 volts for example) and very low current (not readily measurable), and therefor the resistivity of the carbon runs does not appreciably impede the flow of firing pulses from the connectors 18, 18' to the lamps 22, etc. Powdered graphite, which comprises carbon particles having flat flake-like shapes, can be used for the circuit runs instead of or with conventional carbon particles having spherical-like shapes, and has lowered resistance due to better electrical contact between the particles.

As is explained above, the relatively high resistance of carbon circuit runs is not a detriment to firing the flash lamps with firing pulses: however, it has been found that flash arrays having carbon circuit runs instead of silver circuit runs have a greater tendency for accidental flashing of lamps by electrostatic charges, such as can occur when a charged person touches the common connector terminal 31 or 31'. It is the purpose of the shield 45 to reduce the likelihood of electrostatic flashing of the lamps. As is disclosed in U.S. Pat. No. 4,019,043 to Blount, the shield 45 is electrically connected to the common circuit run 52, and hence to the end connector terminals 31, 31', by a contact member such as an eyelet. In the present drawing, this contact member is the wire staple 76. If an electrostatically charged person should touch one of the terminals 31 or 31', the charge is carried to the shield 45 and dissipates into surrounding space and to earth ground, and thus the charge is prevented from reaching the lamps and their sequential flashing circuitry so as to cause lamps to flash. When carbon is used for the circuit runs, its relatively high resistance in the ground circuit run is believed to reduce the effectiveness of carrying electrostatic charges to the shield, and as a result some of the charge is coupled, via stray capacitance, to lamps and firing circuitry thus increasing the chances of accidental flashing of lamps.

In accordance with the present invention, the circuit board 42' of FIG. 5 is substituted for the circuit board 42 in the array of FIGS. 1-4. The circuit board of FIG. 5 is similar to that in FIG. 4 except that the circuit runs comprise deposited carbon particles, and, in accordance with the present invention, two additional wire staples 76a and 76b are provided and extend through holes in the board respectively near the ends of the board and near the connector tabs 18 and 18'. Each of the additional staples 76a and 76b is located so as to contact against the common circuit run 52, as shown in FIG. 5 and the curved legs of these staples contact against the shield 45 behind the circuit board, as shown in FIG. 6. Thus, the shield 45 is electrically connected to each of the common terminals 31 and 31' at locations at or near these terminals, and, whichever one of the connector tabs 18 and 18' is plugged into a camera socket, the shield is electrically grounded through a short and relatively low resistance path which is considerably lower than is the resistance via the common circuit run to the single staple connection 76 at the center of the circuit board as in the prior art. This is found to substantially reduce the possibility of accidental flashing of lamps by electrostatic charges applied to the connector terminals 31, 31'. The center staple shield-connecting means 76 can be eliminated if the manufacturing technique provides reliable shield-connecting grounding by each of the staples 76a and 76b. Alternatively, the center staple 76 can be included to increase protection against electrostatic lamp flashing in the event of poor contact by one of the end staples 76a, 76b.

While preferred embodiments of the invention have been shown and described, various other embodiments and modifications thereof will become apparent to persons skilled in the art, and will fall within the scope of the invention as defined in the following claims. For example, other means connecting the common circuit run to the shield than staples can be used, such as rivets, eyelets, wires, conductive ink, and even direct physical contact. It is intended to limit the present invention, therefore, only to the scope of said following claims.

What we claim as new and desire to secure by United States Letters Patent is:

1. A flash lamp array comprising a plurality of flash lamps in a planar configuration, a plurality of reflectors respectively behind said flash lamps, a circuit board behind and parallel to said reflectors, a conductive shield behind and parallel to said circuit board, said circuit board including first and second integral connector tabs respectively at opposite ends thereof, and a plurality of terminals on each of said connector tabs, wherein the improvement comprises circuit runs on said board of a material having an electrical resistance substantially greater than metal conductors, said circuit runs comprising a common circuit run connected to a first terminal of each of said connector tabs and also connected to a lead-in wire of each of said lamps, said circuit runs comprising a run connected between a second terminal of said first connector tab and sequential firing circuitry of a first group of said lamps and a run connected between a second terminal of said second connector tab and sequential firing circuitry of a second group of said lamps, and means connecting said common circuit run to said shield adjacent to each end of said common circuit run.

2. An array as claimed in claim 1, in which said means connecting the common circuit run to the shield comprises a pair of wire staples.

3. An array as claimed in claim 1, including a third connector means connecting said common circuit run to said shield at the center region of said circuit board.

4. An array as claimed in claim 3, in which said third connector means comprises a wire staple.

5. An array as claimed in claim 1, in which said circuit run material comprises carbon.

* * * * *